US009728717B2

(12) United States Patent
Annunziata et al.

(10) Patent No.: US 9,728,717 B2
(45) Date of Patent: Aug. 8, 2017

(54) MAGNETIC TUNNEL JUNCTION PATTERNING USING LOW ATOMIC WEIGHT ION SPUTTERING

(71) Applicant: International Business Machines Corporation, Armonk, NY (US)

(72) Inventors: Anthony J. Annunziata, Stamford, CT (US); Rohit Kilaru, New York, NY (US); Nathan P. Marchack, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/742,382

(22) Filed: Jun. 17, 2015

(65) Prior Publication Data

US 2016/0260893 A1    Sep. 8, 2016

Related U.S. Application Data

(63) Continuation of application No. 14/636,821, filed on Mar. 3, 2015.

(51) Int. Cl.
*H01L 29/82* (2006.01)
*H01L 43/12* (2006.01)

(52) U.S. Cl.
CPC .................................. *H01L 43/12* (2013.01)

(58) Field of Classification Search
CPC ......... H01L 43/12; H01L 43/02; H01L 43/08; H01L 43/10
See application file for complete search history.

(56) References Cited

U.S. PATENT DOCUMENTS 7,205,164 B1    4/2007 Geha et al.
7,531,367 B2    5/2009 Assefa et al.
(Continued)

OTHER PUBLICATIONS

Guo et al., "Mixing-layer kinetics model for plasma etching and the cellular realization in three-dimensional profile simulator," J. Vac. Sci. Technol. A 27(2), Mar./Apr. 2009.
(Continued)

*Primary Examiner* — Marc Armand
*Assistant Examiner* — Sarah Salerno
(74) *Attorney, Agent, or Firm* — Vazken Alexanian; Michael J. Chang, LLC

(57) ABSTRACT

A method of magnetic tunnel junction patterning for magnetoresistive random access memory devices using low atomic weight ion sputtering. The method includes: providing a magnetoresistive random access memory device including a hard mask metal, a MTJ element, and a semiconductor substrate, wherein the hard mask metal is disposed on the MTJ element and, wherein the MTJ element is disposed on the semiconductor substrate; and etching back the MTJ element into a plurality of MTJ element pillars using a low atomic weight ion sputtering. A magnetoresistive random access memory device using low atomic weight ion sputtering. The device includes: a semiconductor substrate; a plurality of MTJ element pillars disposed on the semiconductor substrate, wherein the plurality of MTJ element pillars is etched from a MTJ element using a low atomic weight ion sputtering; and a hard mask metal disposed on the MTJ element pillars.

14 Claims, 4 Drawing Sheets

(56) References Cited

U.S. PATENT DOCUMENTS

| | | | |
|---|---|---|---|
| 7,550,044 B2 | 6/2009 | Gaidis et al. | |
| 7,936,027 B2 | 5/2011 | Xiao et al. | |
| 7,955,870 B2 | 6/2011 | Ditizio | |
| 8,008,095 B2 | 8/2011 | Assefa et al. | |
| 8,546,263 B2 | 10/2013 | Joubert et al. | |
| 2011/0089511 A1* | 4/2011 | Keshtbod | B82Y 10/00 257/422 |
| 2011/0235217 A1 | 9/2011 | Chen et al. | |
| 2013/0034917 A1 | 2/2013 | Lee | |
| 2014/0070286 A1* | 3/2014 | Rajagopal | A61B 5/04001 257/288 |
| 2015/0014152 A1* | 1/2015 | Hoinkis | H01L 21/32131 204/192.34 |
| 2015/0287911 A1* | 10/2015 | Kim | H01L 27/228 438/3 |
| 2016/0079307 A1* | 3/2016 | Lu | H01L 27/222 257/421 |

OTHER PUBLICATIONS

Boullart et al., "STT MRAM patterning challenges," Advanced Etch Technology for Nanopatterning II, 2013, Proc. of SPIE vol. 8685, 86850F, SPIE (Mar. 2013).
List of IBM Patents or Applications Treated as Related.

* cited by examiner

MAGNETIC TUNNEL JUNCTION PATTERNING USING LOW ATOMIC WEIGHT ION SPUTTERING

CROSS-REFERENCE TO RELATED APPLICATION(S)

This application is a continuation of U.S. application Ser. No. 14/636,821 filed on Mar. 3, 2015, the disclosure of which is incorporated by reference herein.

BACKGROUND OF THE INVENTION

1. Field of the Invention

The present invention relates to the field of magnetoelectronics, and more specifically, the present invention relates to a method for patterning magnetic tunnel junctions using low atomic weight ion sputtering.

2. Description of Related Art

Magnetoresistive random access memory (MRAM) devices can be formed using standard patterning techniques. MRAM devices function as integrated circuits. In a Magnetic tunnel junction (MTJ) electrons pass from one magnetic material to another by tunneling through a thin insulating layer. MTJs within an MRAM generally include metals which are difficult to chemically etch. Positive-tone lithography is often used to pattern MTJ devices and halogen etch gases are used to remove the top mask material.

Ion etching is a process using an inert gas by sputtering to remove atoms. In the prior art, etch chemistries include sputtering using different gas chemistries. Generally, inert gases are used to try to improve selectivity. Inert gases typically used include He, Ar, Xe, and $N_2$.

Sputtering using inert gases in either plasma etch chambers, called reactive ion etching (RIE), or ion beam chambers, called ion beam etching (IBE), can be used to pattern magnetic tunnel junctions. However, the low selectivity of physical sputtering processes using inert gases makes it difficult to control the sidewall profile of the patterned junctions. The difficulty is partially due to erosion of the hard mask for patterning.

Ion etching can cause atoms which are removed to be redeposited, creating residue upon the sidewalls of the MTJ. This is undesirable because the residue can negatively affect the device by causing shorts across the tunneling barrier layer of a MTJ, increase resistance, and degrade the magnetic properties of the device.

Methods to avoid and decrease residue and corrosion of the magnetic tunnel junction have been employed in the prior art. Decreasing residue improves the process yield. Such methods generally include modifying sidewall spacer features, using different power levels for etching different layers, and replacing the hard mask material with another material less prone to oxidation or other adverse reactions.

Sputter chemistries with the ability to passivate the sidewall such as $CH_3OH$ have been used for MTJ patterning. No corrosion is observed when using $CH_3OH$, but the process requires very high ion energies and the etch rate is very low which is undesirable. Alternative chemistries such as $CO/NH_3$ have been employed. Adding $NH_3$ to pure CO etch plasma increases the etch rates, however, the etch rate is still very low. Additionally, experiments in the literature regarding $CO/NH_3$ chemistry have detailed a need for high temperature conditions to drive volatile product formation and this can potentially degrade the magnetic performance.

The etch rate of a sputtering process is directly related to the sputter yield, which is defined as the number of target material atoms removed per impinging etchant ionic species. Sputter yield is hence a unitless ratio that can be converted to an etch rate through knowledge of the atomic density and surface area of the target surface. It has been reported in the art that the sputter yield of a process is dependent on the ratio between the mass of the target atom and the projectile. See, for example, Guo et al., "Mixing-layer kinetics model for plasma etching and the cellular realization in three-dimensional profile simulator," J. Vac. Sci. Technol. A 27(2), March/April 2009, the contents of which are incorporated by reference as if fully set forth herein. The sputtering yield is expressed by:

$$Y_{t\_by\_p} = A(\sqrt{E} - \sqrt{E_{th}})f(\theta) \qquad (1)$$

Yt_by_p represents the sputtering yield coefficient of a target (t) by projectile ion (p). E is the ion bombardment energy. Eth is the threshold energy. A is the linear proportional coefficient, and $f(\theta)$ is a function of off-normal angle $\theta$ to the angular dependence. A is expressed by:

$$A = 0.0054(Z_p Z_t)^{1/2} \sqrt{\left(\frac{M_t}{M_p + M_t}\right)} - 0.0198. \qquad (2)$$

Mt,p is the atomic weight of target and projectile atoms, respectively. Zt,p is the atomic number of target and projectile atoms, respectively. The formula for the threshold energy was recently developed and Eth is expressed by:

$$E_{th} = 25.2(M_t/M_p)^{-0.6} + 0.928(M_t/M_p), \qquad (3)$$

Therefore, there is a need in the art for improved methods for MTJ patterning to increase the sputter yield, leading to better profile control.

BRIEF SUMMARY OF THE INVENTION

The present invention provides a method of magnetic tunnel junction (MTJ) patterning for magnetoresistive random access memory devices using low atomic weight ion sputtering, the method including: providing a magnetoresistive random access memory device including a hard mask metal, a MTJ element, and a semiconductor substrate, wherein the hard mask metal is disposed on the MTJ element and, wherein the MTJ element is disposed on the semiconductor substrate; and etching back the MTJ element into a plurality of MTJ element pillars using low atomic weight ion sputtering.

Another aspect of the present invention provides a magnetoresistive random access memory device including: a semiconductor substrate; a plurality of magnetic tunnel junction (MTJ) element pillars disposed on the semiconductor substrate, wherein the plurality of MTJ element pillars are etched from a MTJ element using a low atomic weight ion sputtering; and a hard mask metal disposed on the MTJ element pillars.

DETAILED DESCRIPTION OF THE PREFERRED EMBODIMENTS

The present invention provides a method for patterning for magnetoresistive random access memory (MRAM) devices using low atomic weight ion sputtering to etch a magnetic tunnel junction (MTJ). The present invention also provides a MRAM device including a MTJ etched using low atomic weight ion sputtering.

The method of MTJ patterning for MRAM devices using low atomic weight ion sputtering includes providing a MRAM device including a hard mask (HM), a MTJ element, and a semiconductor substrate. The HM, typically a HM metal, is disposed on the MTJ element and the MTJ element is disposed on the semiconductor substrate. The MTJ element is etched back into a plurality of MTJ element pillars using a low atomic weight ion sputtering.

The MRAM device includes a HM metal disposed on a MTJ element and a plurality of MTJ element pillars disposed on the semiconductor substrate. The plurality of MTJ element pillars is etched from a MTJ element using a low atomic weight ion sputtering.

In embodiments of the present invention, the HM is etched into HM metal pillars. The HM metal pillars form a template or mold used to etch the MTJ element into MTJ element pillars.

By careful selection of the projectile ions used for sputtering, the selectivity of the process can be improved. Using projectile ions with an atomic weight less than 39.948 atomic mass units (amu) obtains superior MTJ profile control than Ar+ projectile ions with a hard mask at lower ion energies. For instance, with a traditional MTJ system having a tunnel junction stack of Co/Fe/Ni (or elements of similar weight) and a Tantalum-based hard mask material, use of low atomic weight ions such as H and He can provide greater selectivity between the hard mask and the tunnel junction stacks, as compared to heavier inert ions such as Ar, Xe, or Kr.

Generally, with Ar+ projectile ions, or other ions of similar atomic weight, the selectivity is bad and hard mask material is removed. For example, a HM pillar can have a thickness of 100 nm when formed. After the MTJ etch using Ar+, a higher atomic weight ion, typically a lot of height and thickness is lost. The thickness can be reduced to less than 60 nm. Employing lower atomic weight ions results in both lower ion energies and a low momentum. This result is an improvement over all related art. Additionally, in embodiments of the present invention, by using very low atomic weight ions such as H+ or He+ the selectivity is more improved.

Embodiments of the present invention will now be described below with reference to the accompanying drawings. In the following description, elements that are identical are referenced by the same reference numbers in all the drawings unless noted otherwise. The configurations explained here are provided as preferred embodiments, and it should be understood that the technical scope of the present invention is not intended to be limited to these embodiments.

Figure 1:
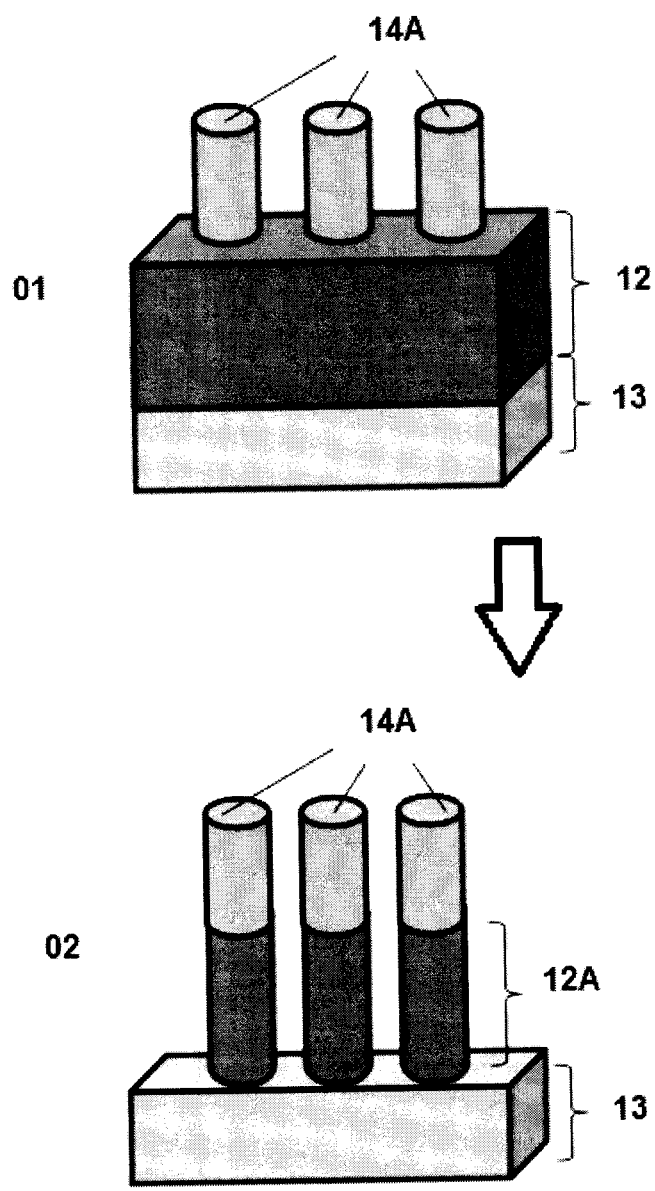
FIG. 1 is a detailed process flow schematic which shows a method for magnetic tunnel junction patterning using low atomic weight ion sputtering according to embodiments of the present invention.

FIG. 1 is a detailed process flow schematic which shows a method for magnetic tunnel junction patterning using low atomic weight ion sputtering according to embodiments of the present invention.

Structure 01 includes hard mask metal pillars 14A disposed on a MTJ element 12. MTJ element 12 is disposed on a semiconductor substrate 13. As will be described in detail below, according to an exemplary embodiment of the present techniques the hard mask metal pillars are created by depositing material into vias patterned in a soft mask. Thus, this is an additive method. By comparison, in conventional processes involving a hard mask a subtractive method is often employed, where a hard mask material is blanket deposited and then patterned using a mask template.

MTJ element 12 includes a plurality of magnetic thin films with a tunnel barrier. In an embodiment of the present invention, a MTJ with an oxide tunnel barrier is used.

Generally, the plurality of magnetic thin films is selected from a group including: cobalt, iron, nickel, cobalt alloy, iron alloy, nickel alloy, nitrides and oxides. The tunnel barrier is selected from a group including: tantalum, titanium, ruthenium, magnesium, aluminum, copper, tantalum alloy, titanium alloy, ruthenium alloy, magnesium alloy, aluminum alloy, copper alloy, and nitrides and oxides.

Structure 02 includes hard mask metal pillars 14A disposed on a plurality of MTJ element pillars 12A. MTJ element 12 is etched back into a plurality of MTJ element pillars 12A using a low atomic weight ion sputtering.

Low atomic weight ion physical sputtering requires selecting a low atomic weight projectile ion for sputtering. According to an embodiment of the present invention the projectile ions have an atomic weight less than Ar+, which is 39.948. This means that Ar+, which is typically used for sputtering, is not used. Rather, a lower atomic weight ion is used to achieve better selectivity. In a preferred embodiment of the present invention He+ ions are selected as the projectile ion. According to another preferred embodiment of the present invention H+ ions are selected as the projectile ions.

Using projectile ions with an atomic weight less than Ar+, 39.948 amu, results in better selectivity. This is advantageous over the prior art because less HM is removed than sputtering with other gas chemistries. Low atomic weight ions result in lower ion energies. Additionally, lower atomic weight ions produce low momentum.

Physical sputtering using low atomic weight projectile ions produces better profile control and an increased sputter rate compared to the prior art. The selectivity between the HM metal and MTJ element is improved.

The present invention provides a method to obtain improved sidewall profiles (e.g., sidewalls that are more vertical with less damage initially to the hard mask). The sidewall profiles refer to the sides of the pillars of the patterned junctions or sides of MTJ element pillars 12A.

Advantageously, in structure 02 the semiconductor substrate is not affected by the sputtering step, according to an embodiment of the present invention.

Figure 2:
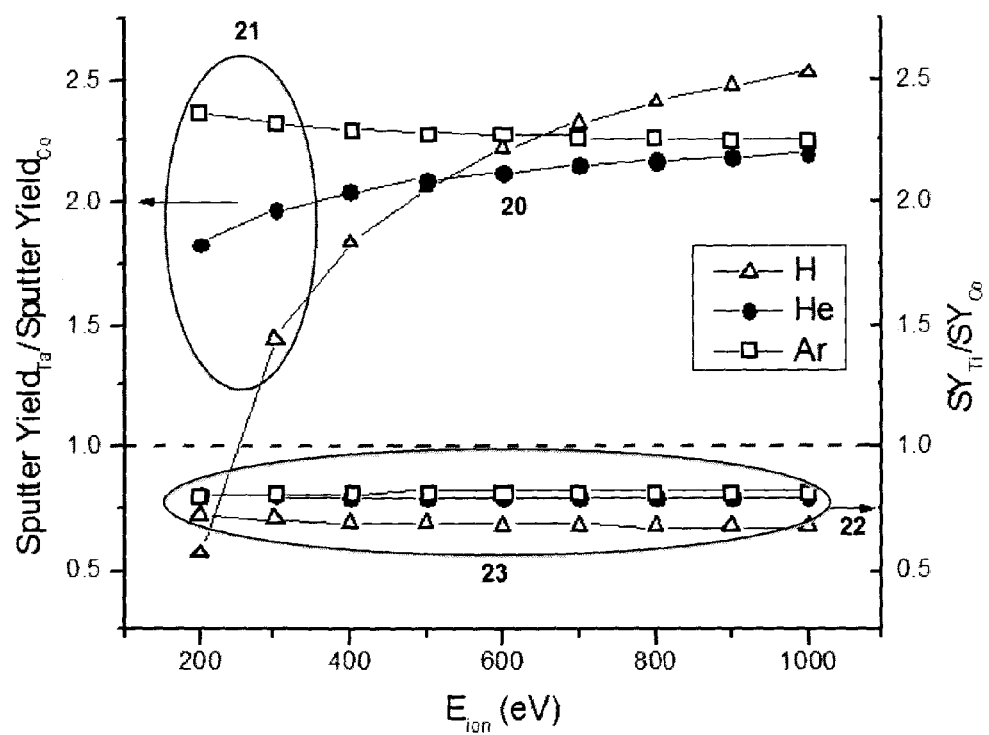
FIG. 2 is a line graph illustrating the sputter yield between a hard mask and magnetic tunnel junction for different atomic weight ions at different ion levels according to embodiments of the present invention.

FIG. 2 is a line graph illustrating the sputter yield (SY) for different atomic weight ions at different ion levels according to embodiments of the present invention. The atomic weight ions or projectile ions illustrated in FIG. 2 are Hydrogen (H), Helium (He), and Argon (Ar).

By using low atomic weight ions the selectivity between the HM and MTJ materials is improved, leading to better profile control than in an Ar based sputtering process.

The plot of atomic weight ions 20 represents the sputter yield according to an embodiment of the present invention where HM metal is Tantalum (Ta) based and a MTJ element includes a plurality of Cobalt (Co) magnetic thin films. The reference numeral 20 refers to the plots above the dotted line in FIG. 2. The plot of atomic weight ions 22 represent the sputter yield according to an embodiment of the present invention where HM metal has a lower atomic weight and is Titanium (Ti) based. The reference numeral 22 refers to the plots below the dotted line in FIG. 2. The MTJ element includes a plurality of Co magnetic thin films. Namely, the plots above the dotted line in FIG. 2 show the sputter yield ratios of Tantalum to Cobalt (Tantalum being the hard mask material and Cobalt being the MTJ material) for H, He and Ar ions (triangle, circle and square, respectively). So a ratio of less than one is preferable because it means less Ta is sputtered away than Co. The plot shows that at lower ion energies, lower Ta/Co sputter yield ratio is achieved by low atomic weight ions (i.e., H/He). The plots below the dotted line in FIG. 2 show the scenario where the HM metal is Titanium (Ti) based.

Lower atomic weight ions, as illustrated, show better selectivity between any HM metal and MTJ elements. Circle 21 illustrates the lower ion energies produced with H and He. The heavier Ar atomic weight ions produced higher energies.

When low atomic weight ions are used in physical sputtering processes, the sputter rate is inversely dependent on the atomic weight of the target atoms being etched. For example, according to an embodiment of the present invention, Ta which has a higher atomic weight than Co etches slower than Co, and Ti which has a lower atomic weight than Co etches faster than Co. Circle 23 illustrates how sputter yield remains relatively constant with a Ti based HM metal and how lower ion energies are obtained.

Figure 3:
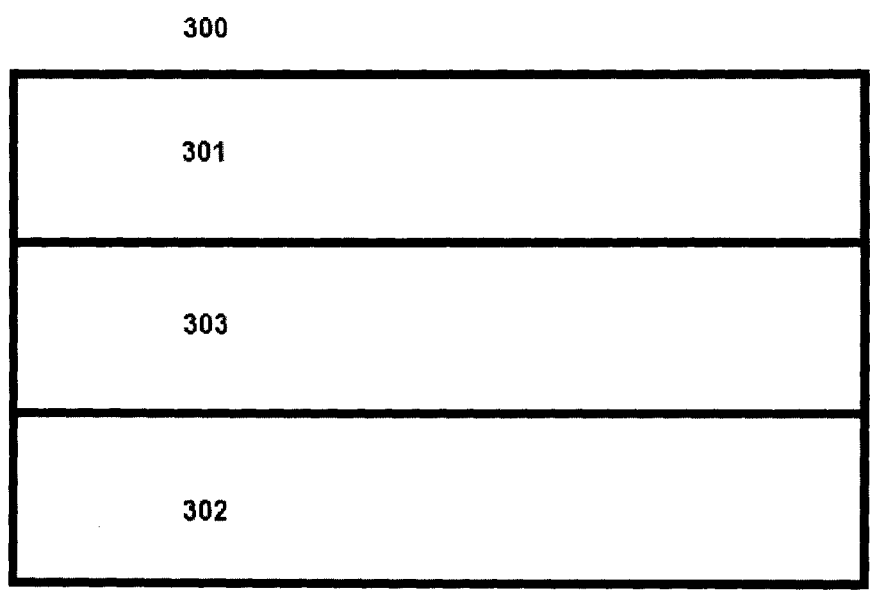
FIG. 3 is a schematic cross-sectional diagram of a magnetic tunnel junction according to embodiments of the present invention.

FIG. 3 is a schematic cross-sectional diagram of a MTJ element 300 according to embodiments of the present invention. An MTJ element 300 includes two layers of magnetic metal called thin films 301 and 302. The thin films 301 and 302 can be selected from a group including: tantalum, titanium, ruthenium, magnesium, aluminum, copper, tantalum alloy, titanium alloy, ruthenium alloy, magnesium alloy, aluminum alloy, copper alloy, and nitrides and oxides.

In an embodiment of the present invention, the magnetic thin films 301 and 302 are separated by an ultra thin layer (e.g., from about 2 nanometers (nm) to about 3 nm, and ranges therebetween) of insulator or tunnel barrier 303. Tunnel barrier 303 can be selected from a group including: cobalt, iron, nickel, cobalt alloy, iron alloy, nickel alloy, and nitrides and oxides.

Figure 4:
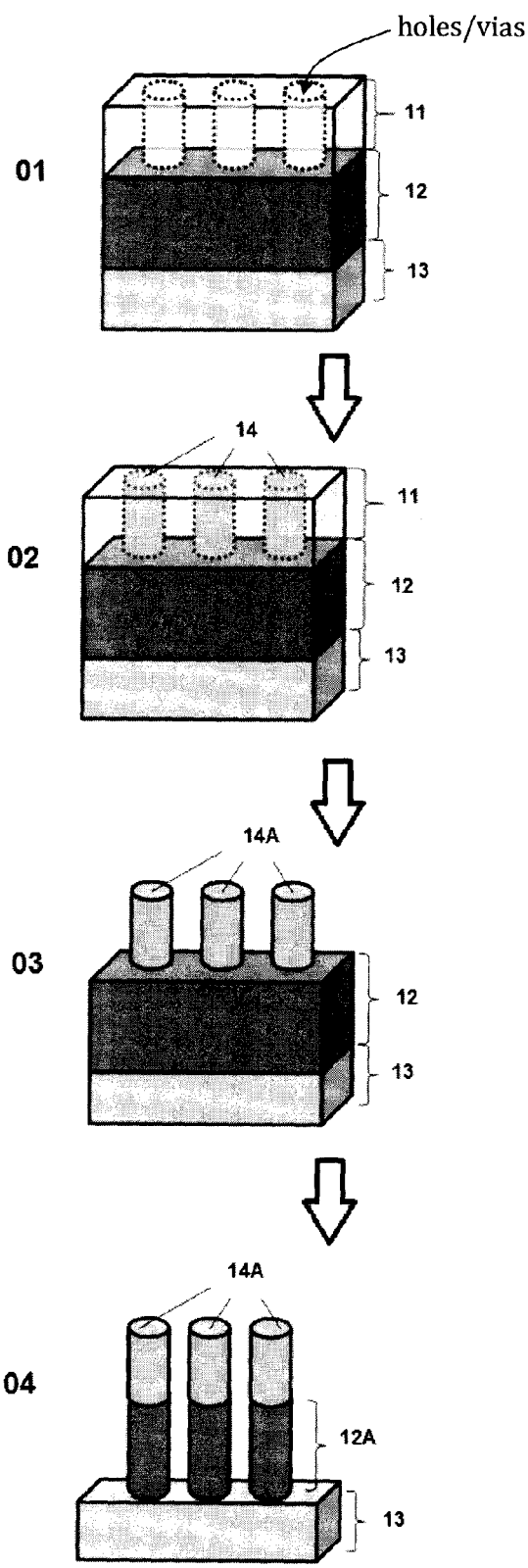
FIG. 4 is a detailed process flow schematic which shows a method for magnetic tunnel junction patterning using low atomic weight ion sputtering according to embodiments of the present invention.

FIG. 4 is a detailed process flow schematic which shows a method for MTJ patterning using low atomic weight ion sputtering according to embodiments of the present invention. Structure 01 includes a soft mask material 11 disposed on a MTJ element 12. MTJ element 12 is disposed on a semiconductor substrate 13. By applying negative-tone photolithography (pattern reversal) or electron beam lithography, a plurality of holes or vias is etched into the soft mask material. The patterned soft mask material will serve as a template for the hard mask (see below). Thus, according to an exemplary embodiment of the present invention the template for the hard mask is deposited upon a MTJ element 12. MTJ element 12 includes a plurality of magnetic thin films with a tunnel barrier.

Using negative-tone photolithography is more stable and reliable at small feature sizes than the positive-tone lithography that is commonly employed in the prior art. Additionally, patterning holes is more stable and reliable than resist islands. However, in embodiments of the present techniques a positive-tone lithography can be used.

In structure 02 HM metal pillars 14 are deposited in soft mask material 11. In an embodiment of the present invention, HM metal pillars 14 are Ta based. In another embodiment of the present invention HM metal pillars 14 are Ti based. In embodiments of the present invention, HM metal pillars 14 can include TaN, TiN, Ta, Pt or a combination thereof.

After the HM metal pillars 14 are deposited, in structure 02, the HM metal pillars 14 are planarized. Planarizing is completed by either etching back or polishing back excess HM pillar material, according to embodiments of the present invention.

Etching back HM metal pillars 14 can include using gases in either plasma etch chambers, called reactive ion etching (RIE), or ion beam chambers, called ion beam etching (IBE). To etch back by RIE, Cl, CF4, or SF6 can be used. To etch back by IBE, H, He, Ar, or Xe can be used. Polishing back HM metal pillars 14 includes applying chemical mechanical polish (CMP).

In structure 03, soft mask material 11 is selectively removed from the structure. Once soft mask material 11 is removed, a plurality of HM metal pillars 14A remain disposed on the MTJ element 12. Soft mask 11 is removed, according to embodiments of the present invention, using $O_2$, $N_2/H_2$, or He plasma.

In structure 04, a second RIE step is used to etch through the magnetic material by using a non-magnetic material as a HM. The MTJ element 12 is etched back by employing low atomic weight sputtering. Low atomic weight sputtering as discussed above improves selectivity. Low atomic weight sputtering includes using a projectile ion with an atomic weight less than Ar+, 39.948 amu. According to an embodiment of the present invention, projectile ions include H+ or He+. Thereby, MTJ element 12 is etched back into a plurality of MTJ pillars 12A.

Physical sputtering using low atomic weight ions produces better profile control and an increased sputter rate than using higher atomic weight projectile ions. The selectivity between the HM metal pillars and MTJ element is improved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of magnetic tunnel junction (MTJ) patterning for magnetoresistive random access memory devices, the method comprising:
   providing a magnetoresistive random access memory device including a MTJ element, and a semiconductor substrate, wherein said MTJ element is disposed on said semiconductor substrate;
   disposing a soft mask material on said MTJ element;
   etching a plurality of vias in said soft mask material using electron beam lithography;
   selectively depositing a hard mask metal pillar in the plurality of vias in said soft mask material;

etching back said hard mask metal pillar to planarize said hard mask metal pillar;

removing said soft mask material leaving said plurality of hard mask metal pillars disposed on said MTJ element; and etching back said MTJ element into a plurality of MTJ element pillars using a low atomic weight ion sputtering that does not affect said semiconductor substrate.

2. The method according to claim 1, further comprising:
selecting a low atomic weight projectile ion for sputtering, wherein said low atomic weight projectile ion has an atomic weight less than 39.948 amu.

3. The method according to claim 2, wherein said low atomic weight projectile ion is selected from a group of ions consisting of: H+ and He+.

4. The method according to claim 2, wherein said MTJ element comprises cobalt, and wherein a sputter yield ratio of said hard mask metal pillar to cobalt by said low atomic weight projectile ion is less than one.

5. The method according to claim 1, wherein said hard mask metal is Tantalum or Titanium based in composition.

6. The method according to claim 1, wherein said hard mask metal is a plurality of hard mask metal pillars.

7. The method according to claim 1, wherein the step of etching back said hard mask metal pillar comprises:

etching back, applying ion beam etching, excess said hard mask metal pillar.

8. The method according to claim 1, wherein said MTJ element comprises:
a plurality of magnetic thin films with a tunnel barrier.

9. The method according to claim 8, wherein said plurality of magnetic thin films is selected from a group consisting of: cobalt, iron, nickel, cobalt alloy, iron alloy, nickel alloy, and nitrides and oxides.

10. The method according to claim 8, wherein said tunnel barrier is selected from a group consisting of: tantalum, titanium, ruthenium, magnesium, aluminum, copper, tantalum alloy, titanium alloy, ruthenium alloy, magnesium alloy, aluminum alloy, copper alloy, and nitrides and oxides.

11. The method according to claim 1, wherein said hard mask metal comprises tantalum nitride.

12. The method according to claim 1, wherein said hard mask metal comprises titanium nitride.

13. The method according to claim 1, wherein said hard mask metal comprises platinum.

14. The method according to claim 1, wherein the step of removing said soft mask material comprises:
removing said soft mask material by applying a plasma selected from the group consisting of: oxygen plasma, nitrogen/hydrogen plasma, and helium plasma.

* * * * *